US006564447B1

United States Patent
Seng

(10) Patent No.: US 6,564,447 B1
(45) Date of Patent: May 20, 2003

(54) NON LEAD FRAME CLAMPING FOR MATRIX LEADLESS LEADFRAME PACKAGE MOLDING

(75) Inventor: Kang Aik Seng, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 167 days.

(21) Appl. No.: 09/714,368

(22) Filed: Nov. 15, 2000

(51) Int. Cl.[7] .............................................. H01R 43/00

(52) U.S. Cl. .............................. 29/827; 29/841; 29/855; 29/858

(58) Field of Search ..................... 29/827, 841, 855, 29/858

(56) References Cited

U.S. PATENT DOCUMENTS 6,104,089 A * 8/2000 Akram ....................... 257/679

* cited by examiner

Primary Examiner—Timothy V. Eley
Assistant Examiner—Alvin J. Grant
(74) Attorney, Agent, or Firm—Beyer Weaver & Thomas, LLP

(57) ABSTRACT

A mold for taped lead frame assemblies is provided. The mold has a mold cavity large enough to hold an entire lead frame assembly. A taped lead frame assembly is placed completely in the mold cavity. A cover is used to cover the mold cavity. The cover is spaced apart from the taped lead frame assembly. A riser may be used to provide the spacing between the cover and the taped lead frame assembly, so that the cover does not contact the taped lead frame assembly. An encapsulation material is placed in the mold cavity and then hardened. The encapsulated taped lead frame assembly is then removed from the mold and singulated.

17 Claims, 3 Drawing Sheets

NON LEAD FRAME CLAMPING FOR MATRIX LEADLESS LEADFRAME PACKAGE MOLDING

FIELD OF THE INVENTION

The present invention relates generally to integrated circuits. More specifically, the invention relates to packaging integrated circuits.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a lead frame panel 100 and attached dice that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips (dice) 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed plastic or ceramic housing around each IC chip or by dispensing and molding a layer of encapsulation material over all IC chips 124. FIG. 2 is a cross-sectional view of part of the lead frame panel 100 and IC chips 124. A tape 136 may be placed across the bottom of the lead frame panel 100 and a mold 132, 133, 134 may be placed around the lead frame panel 100. In this example, the mold is clamped on to the tape 136. In other examples, the mold may be clamped on to both the tape layer 136 and part of the lead frame panel 100. An encapsulation material 140 is provided to fill the mold, encapsulating the IC chips 124, the wire bonds 128, and part of the lead frame panel 100. The tape 136 and the clamping by the mold 132, 133, 134 prevents the encapsulation material 140 from passing through the lead frame panel 100. Once the encapsulation material 140 is hardened, the mold 132, 133, 134 and tape 136 may be removed. The encapsulation material 140 may be cut to singulate the IC chips 124 and leads 108.

The current heavy clamping of the tape or lead frame and tape to prevent leakage may tear the tape, which could cause leakage, or may result in uneven clamping, which may cause increased flashing. The tearing of the tape may also make removal of the tape more difficult.

It would be desirable to provide a method of preventing leakage, tearing of the tape, and flashing.

SUMMARY OF THE INVENTION

To achieve the foregoing and other objects and in accordance with the purpose of the present invention, a variety of techniques is provided for providing encapsulated dice. Generally, a plurality of dice is connected to a first side of a frame. Tape is attached to a second side of the frame. The dice, frame, and tape are placed completely in a mold cavity. A cover is placed over the mold cavity.

Another embodiment of the invention provides a mold for encapsulating dice attached to a first side of a lead frame with a tape layer covering a second side of the lead frame to form a lead frame assembly. The mold comprises a bottom portion with a cavity large enough to contain the entire lead frame assembly and a cover for covering the mold cavity.

These and other features of the present invention will be described in more detail below in the detailed description of the invention and in conjunction with the following figures.

BRIEF DESCRIPTION OF THE DRAWINGS

The present invention is illustrated by way of example, and not by way of limitation in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
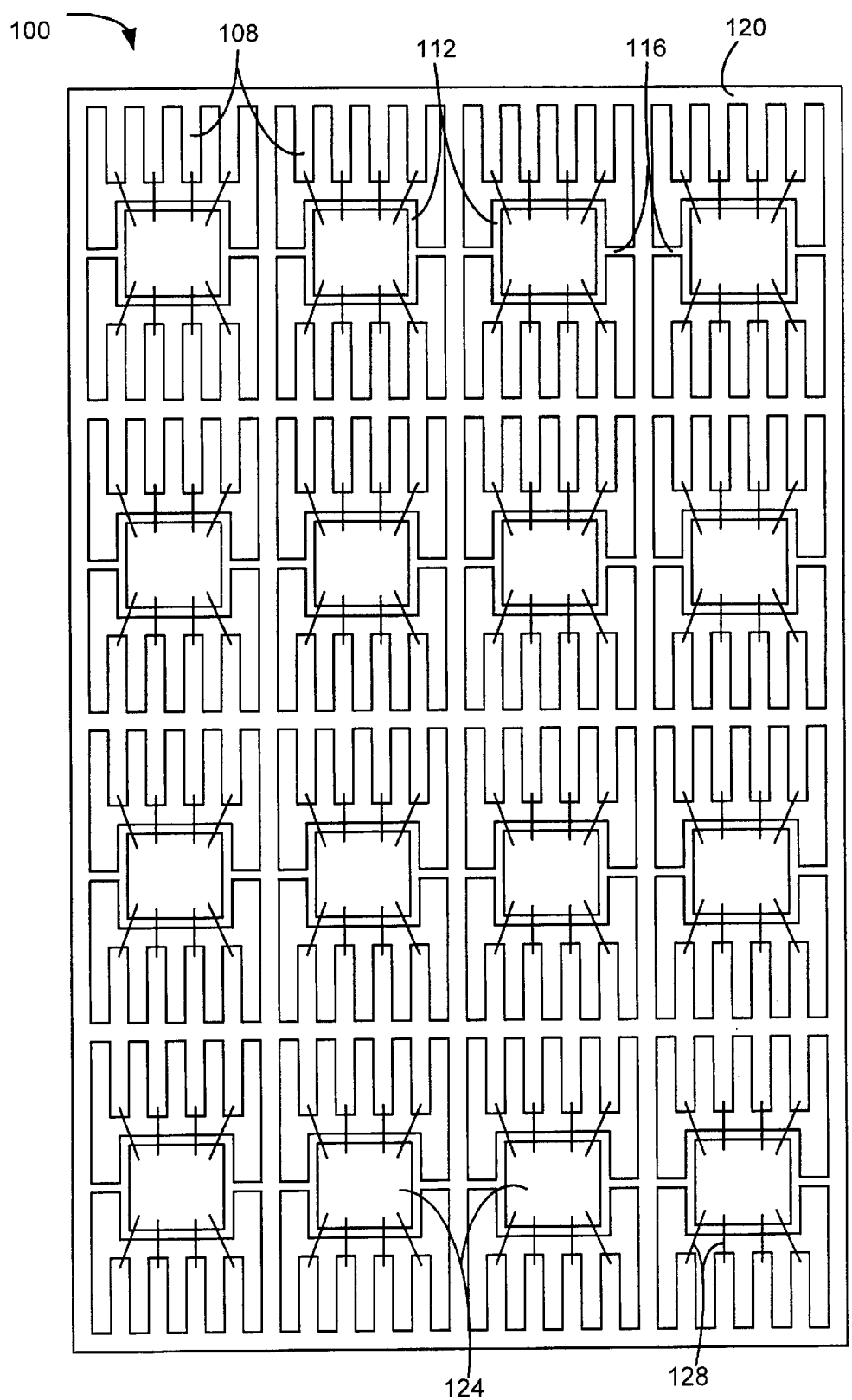
FIG. 1 is a top view of a lead frame panel and attached dice that may be used in the prior art.
Figure 2:
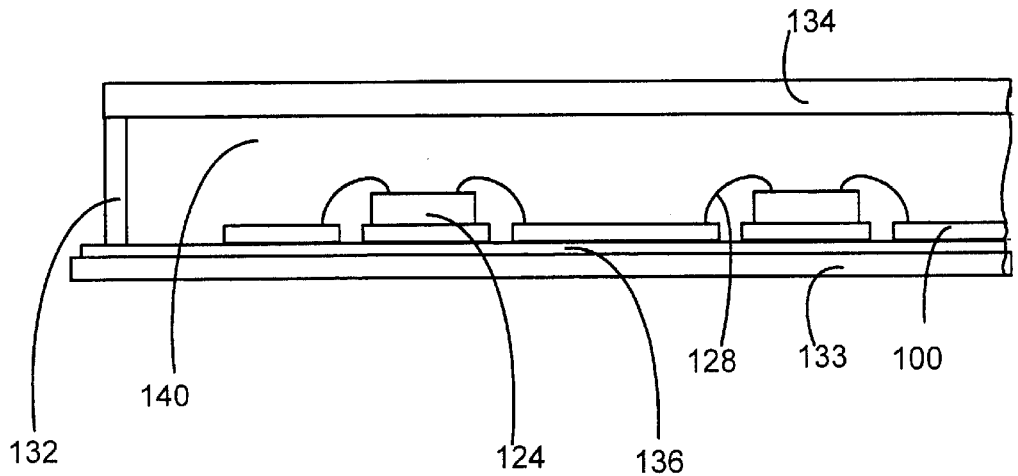
FIG. 2 is a cross-sectional view of part of the lead frame panel and IC chips in a mold used in the prior art.
Figure 3:
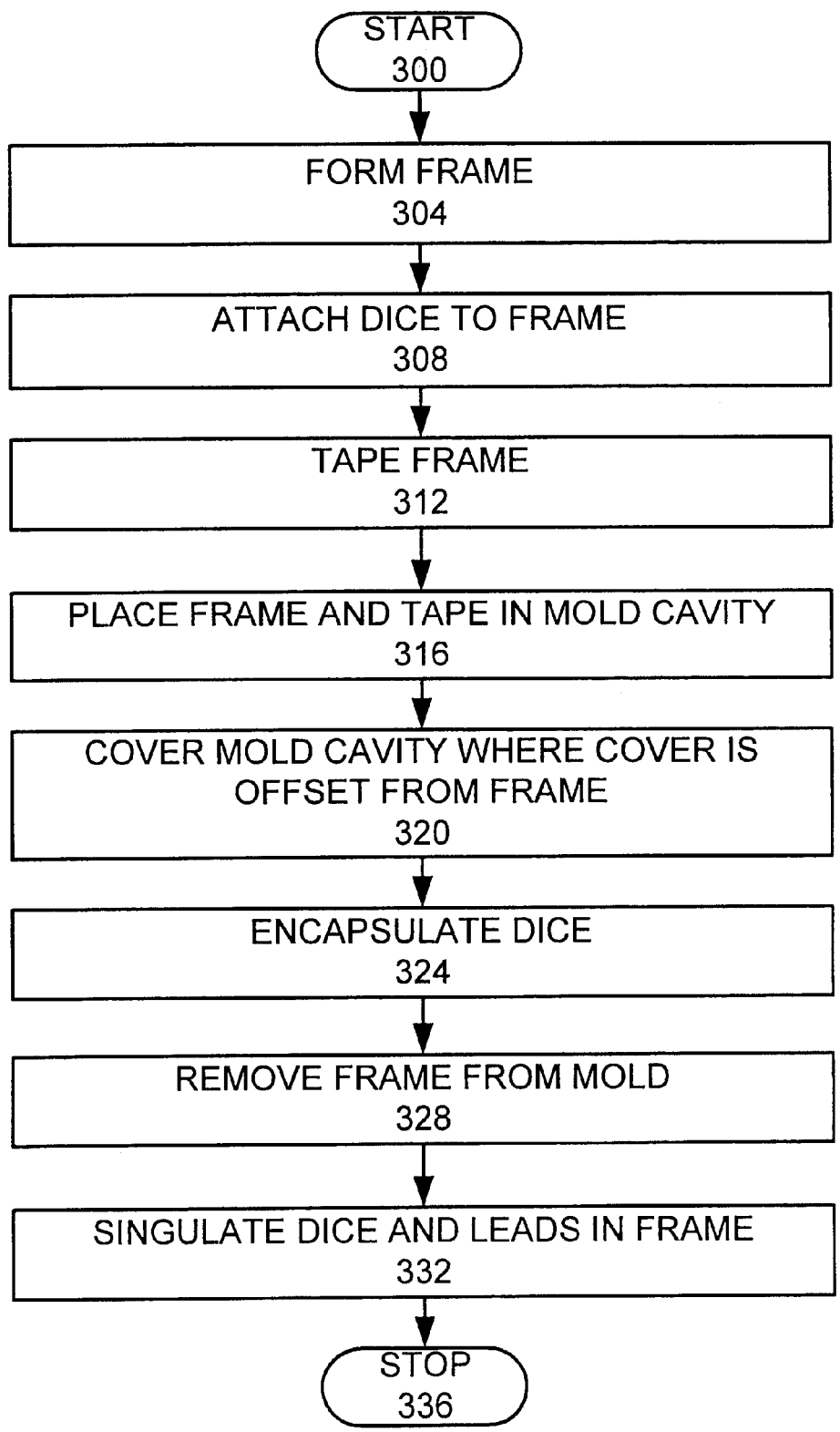
FIG. 3 is a flow chart of a method used in a preferred embodiment of the invention.

To facilitate discussion, FIG. 3 is a flow chart of a method used in a preferred embodiment of the invention. According to the flow chart of FIG. 3, a frame is formed (step 304) and dice are attached to the frame 308, to form a lead frame assembly. The frame and dice may for example be the frame 100 and dice 124, as shown in FIG. 1. The frame 100 may comprise leads 108, die attach pads 112, ties 116 for supporting the die attach pads 112, and a skirt 120. Wire bonds 128 may be used to attach the dice 124 to the leads 108.

Figure 4:
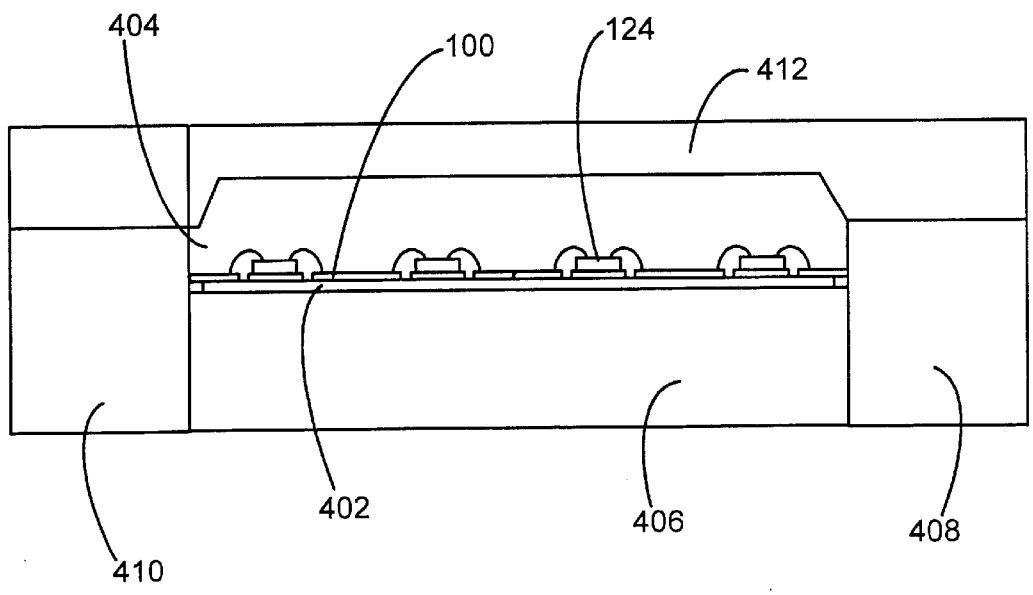
FIG. 4. is a cross-sectional view of a taped lead frame with attached dice in a mold used in a preferred embodiment of the invention.

The side of the frame 100 opposite from the side attached to the dice 124 is taped (step 312), to form a taped lead frame assembly, and then the tape 402, the frame 100, and dice 124 are placed in a mold cavity 404 (step 316), as shown in FIG. 4. In a preferred embodiment of the invention, the mold cavity 404 is formed by a bottom mold 406, a bottom riser block 408, and a cull block 410. A cover 412 is placed over the mold cavity 404 (step 320). The bottom block riser 408 supports the cover 412 and keeps the cover 412 spaced (or offset) apart from the tape 402, frame 100, and dice 124 so that there is no contact or clamping between the any part of the mold and the tape 402, frame 100, and dice 124. Instead, direct contact is made between all parts of the mold, such that the cover 412 directly contacts and clamps to the bottom riser block 408 and the cull block 410, so that the tape 402, frame 100, and dice 124 are not clamped between the cover 412 and the cull block 410 or the bottom block riser 408. In addition, the bottom mold 406 is in direct contact with and may be clamped to the bottom riser block 408 and the cull block 410. In this example, the tape 402 is placed on an upper surface of the bottom mold 406, which forms an inner surface of the mold cavity, so that the entire tape is adjacent an interior surface of the mold cavity.

An encapsulation material, such as a polymer or ceramic, is placed in the mold to encapsulate the dice 124 and parts of the frame 100 (step 324). When the encapsulation material is hardened, the encapsulation material, dice 124, frame 100, and tape 402 are removed from the mold (step 328). The tape 402 may be removed from the frame 100. The encapsulation material and frame 100 may be cut to singulate the dice and leads in the frame (step 332).

Since the tape 402, frame 100, and dice 124 are placed completely in the mold cavity so that the mold may be covered without any clamping of the tape 402, frame 100, and dice 124, damage to the tape 124 and the requirement of heavy clamping through uneven layers of the frame and tape may be eliminated.

In another embodiment of the invention, the mold bottom, bottom riser block, and cull block may form a single unit, so that a single unit may be used to form the mold cavity in which the tape, frame, and dice are placed.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents that fall within the true spirit and scope of the present invention.

What is claimed is:

1. A method for providing encapsulated dice, comprising:
   connecting a plurality of dice to a first side of a frame;
   attaching tape to a second side of the frame;
   placing the dice, frame, and tape completely in a mold cavity; and
   placing a cover over the mold cavity.

2. The method, as recited in claim 1, wherein the cover is spaced apart from the dice, frame, and tape.

3. The method, as recited in claim 2, wherein the cover is directly clamped to and in direct contact with a part of the mold forming the mold cavity.

4. The method, as recited in claim 3, further comprising the step of placing an encapsulation material in the mold cavity.

5. The method, as recited in claim 4, wherein the step of placing the dice, frame, and tape in the mold cavity, comprises placing the tape on an inner surface of the mold cavity.

6. The method, as recited in claim 5, wherein the entire tape is adjacent to the inner surface of the mold cavity.

7. The method, as recited in claim 6, wherein the mold cavity is formed by a bottom mold, a cull block, and a bottom riser block, wherein the bottom riser block spaces the cover apart from the tape, frame, and dice.

8. The method, as recited in claim 7, wherein the encapsulation material is from the group consisting of a polymer and a ceramic.

9. The method, as recited in claim 8, further comprising:
   hardening the encapsulation material;
   removing the hardened encapsulation material, frame, tape, and dice from the mold cavity; and
   singulating the dice.

10. The method, as recited in claim 9, further comprising removing the tape from the frame.

11. A mold for encapsulating a dice attached to a first side of a lead frame with a tape layer covering a second side of the lead frame to form a taped lead frame assembly, comprising:
    a bottom portion defining mold cavity large enough to contain the entire lead frame assembly; and
    a cover for covering the mold cavity, wherein the bottom portion spaces the cover apart from the lead frame assembly.

12. The mold, as recited in claim 11, wherein the bottom portion defines a riser that supports the cover and spaces the cover apart form the lead frame assembly.

13. The mold, as recited in claim 12, wherein the cover and bottom portion are formed to directly clamp the cover to the bottom portion.

14. A method for providing encapsulated dice, comprising:
    placing a taped lead frame assembly in a mold cavity; and
    placing a cover over the mold cavity.

15. The method, as recited in claim 14, wherein the cover is spaced apart from the taped lead frame assembly.

16. The method, as recited in claim 15, further comprising the step of placing an encapsulation material in the mold cavity.

17. The method, as recited in claim 16, further comprising:
    hardening the encapsulation material;
    removing the hardened encapsulation material and the taped lead frame assembly from the mold cavity; and
    singulating the dice.

* * * * *